United States Patent
La Rosa

(10) Patent No.: US 8,305,815 B2
(45) Date of Patent: Nov. 6, 2012

(54) SENSE AMPLIFIER WITH FAST BITLINE PRECHARGE MEANS

(75) Inventor: Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 187 days.

(21) Appl. No.: 12/907,720

(22) Filed: Oct. 19, 2010

(65) Prior Publication Data
US 2011/0090745 A1    Apr. 21, 2011

(30) Foreign Application Priority Data
Oct. 20, 2009   (FR) .................................... 09 05037

(51) Int. Cl.
*G11C 11/34*    (2006.01)
(52) U.S. Cl. .................. 365/185.21; 365/196; 365/205; 365/207; 365/185.25

(58) Field of Classification Search ............. 365/185.21, 365/196, 205, 207, 185.25, 89.8
See application file for complete search history.

(56) References Cited

U.S. PATENT DOCUMENTS

| | | | |
|---|---|---|---|
| 5,764,572 A * | 6/1998 | Hammick | 365/189.15 |
| 6,169,701 B1 | 1/2001 | Eto et al. | |
| 7,106,635 B1 | 9/2006 | Mandal | |
| 2008/0130375 A1 | 6/2008 | Raghavan et al. | |

* cited by examiner

*Primary Examiner* — Jason Lappas
(74) *Attorney, Agent, or Firm* — Seed IP Law Group PLLC

(57) ABSTRACT

The disclosure relates to a sense amplifier comprising a cascode transistor and means for biasing the cascode transistor, supplying a control voltage to a gate terminal of the cascode transistor. The means for biasing the cascode transistor comprise means for isolating the gate terminal of the cascode transistor from the output of the voltage generator during a first period of the precharge phase, so as to boost the bitline voltage, then for linking the gate terminal to the output of the voltage generator during a second period of the precharge phase. Application in particular to sense amplifiers for non-volatile memories.

24 Claims, 4 Drawing Sheets

SENSE AMPLIFIER WITH FAST BITLINE PRECHARGE MEANS

BACKGROUND

1. Technical Field

The present disclosure relates to sense amplifiers, in particular for reading nonvolatile memory cells, and more particularly to the management of a precharge phase of bitlines of a memory array, before reading a memory cell.

2. Description of the Related Art

Sense amplifiers are conventionally used to sense the state of memory cells and to output a data signal that is a function of that state. FIG. 1 shows schematically the structure of a sense amplifier SA1. The sense amplifier comprises a sensing unit SU, a precharge unit PU, a cascode transistor TC, a biasing unit BU1 and a sense input SI. The cascode transistor TC comprises a gate terminal (G), a drain terminal (D) linked to the sensing unit SU and to the precharge unit PU, and a source terminal (S) connected to the sense input SI. The sense input SI is linked, through a bitline BL, to a memory cell MC to be sensed.

The sensing of the memory cell MC comprises a precharge phase and a read phase. At the beginning of the precharge phase, the precharge unit PU applies a precharge voltage V1 to the drain terminal of the cascode transistor TC and the biasing unit BU1 applies a control voltage Vc to the gate terminal of the cascode transistor, which becomes conducting. The source terminal (S) of the cascode transistor TC supplies a bitline voltage Vbl to the bitline BL through the sense input SI. Voltage Vbl increases and reaches a desired bitline precharge voltage. Then, the precharge voltage V1 ceases to be applied to the cascode transistor, the sensing unit SU is enabled and the read phase starts. The sensing unit SU senses the state of the memory cell MC and outputs a data (D) representing the state of the memory cell.

In order to reduce the read time and minimize stress on the bitlines, the voltage Vbl should be brought as quickly as possible during the precharge phase to the bitline precharge voltage, typically 0.8V or less. Two conventional embodiments of the biasing unit are shown in FIGS. 2A and 3B.

FIG. 2A shows a sense amplifier SA2 comprising a closed loop biasing unit BU2. The biasing unit BU2 comprises a logic gate LG supplying a control voltage Vc to the gate terminal (G) of the cascode transistor TC. The logic gate LG, for example a NOR gate, is connected on one input to the source terminal (S) of the cascode transistor TC and receives on another input a control signal CSG.

At the beginning of the precharge phase, the control signal CSG is set from 1 to 0 and the bitline voltage Vbl is low. The output of the NOR gate goes to 1 which quickly brings the control voltage Vc to a high level, as shown in FIG. 2B, thereby activating the cascode transistor TC. The cascode transistor starts to conduct and the bitline voltage Vbl increases, as also shown in FIG. 2B. When voltage Vbl reaches a trigger point of the logic gate LG, the latter enters an intermediary logic state that is neither 0 nor 1, causing the control voltage Vc to decrease. The decrease of voltage Vc decreases the conductivity of the cascode transistor, thereby slowing down the rate of increase of bitline voltage Vbl until it reaches the desired bitline precharge voltage Vblpre.

FIG. 3A shows a sense amplifier SA3 comprising an open loop biasing unit BU3. The biasing unit BU3 comprises a voltage generator VG having an output linked to the gate terminal of the cascode transistor TC and supplying the control voltage Vc. The voltage generator VG applies voltage Vc to the gate terminal of the cascode transistor TC at the beginning of the precharge phase, as shown in FIG. 3B, thereby setting the cascode transistor TC in the conducting state. The bitline voltage Vbl increases, as shown in FIG. 3B, until it reaches the desired bitline precharge voltage Vblpre. The control voltage is approximately set to a value equal to Vblpre+Vt and therefore is not very high. For this reason, the bitline voltage Vbl has a rising slope RS3 that is less than the rising slope RS2 of the voltage bitline Vbl in FIG. 2B, obtained with the closed loop biasing unit BU2.

In summary, the biasing unit BU2 shown in FIG. 2A allows for a rapid bitline precharge. However, the logic gate LG in the intermediary logic state has a high static current consumption because its pull-up and pull-down transistors are both in the conducting state, while the biasing unit BU3 shown in FIG. 3A has a very low current consumption.

Therefore, it may be desired to provide a sense amplifier having a biasing unit offering a fast precharge time while presenting a low consumption.

BRIEF SUMMARY

Embodiments of the disclosure relate to a sense amplifier comprising a precharge unit providing a precharge voltage during a precharge phase, a voltage generator having an output providing a bias voltage, a cascode transistor comprising a gate terminal, a drain terminal receiving the precharge voltage, and a source terminal supplying the sense input with a bitline voltage lower than the precharge voltage, and means for biasing the cascode transistor using the bias voltage, supplying a control voltage to the gate terminal of the cascode transistor. The means for biasing the cascode transistor comprise: at least one gate-ground capacitor, one gate-source capacitor and one gate-drain capacitor for the cascode transistor, and means for isolating the gate terminal of the cascode transistor from the output of the voltage generator during a first period of the precharge phase, so as to boost the bitline voltage, then for linking the gate terminal to the output of the voltage generator during a second period of the precharge phase.

In one embodiment, the means for isolating the gate terminal from the voltage generator comprise a switch.

In one embodiment, the means for isolating the gate terminal from the voltage generator comprise a resistor whose anode receives the bias voltage and whose cathode is linked to the gate terminal of the cascode transistor, and a capacitor linking the anode of the resistor to ground.

In one embodiment, the means for isolating the gate terminal from the voltage generator comprise a p-channel transistor with a source terminal receiving the bias voltage, a drain terminal connected to the gate terminal of the cascode transistor, and a gate terminal connected to ground, and a capacitor linking the source terminal of the p-channel transistor to ground or to a voltage lower than the bias voltage.

In one embodiment, at least one of the gate-ground capacitor, the gate-source capacitor and the gate-drain capacitor is or includes a parasitic capacitance of the cascode transistor.

Embodiments of the disclosure also relate to a memory array comprising at least one sense amplifier according to the disclosure.

Embodiments of the disclosure also relate to an integrated circuit on a semiconductor chip, comprising a memory array comprising at least one sense amplifier according to the disclosure.

Embodiments of the disclosure also relate to a handheld device comprising an integrated circuit on a semiconductor chip, the integrated circuit comprising a memory array comprising at least one sense amplifier according to the disclosure.

Embodiments of the disclosure also relate to a method for performing a precharge phase on a bitline in a memory array before reading a memory cell, implemented with a sense amplifier comprising a precharge unit providing a precharge voltage during a precharge phase, a voltage generator having an output providing a bias voltage, and a cascode transistor comprising a gate terminal, a drain terminal receiving the precharge voltage, and a source terminal supplying the sense input with a bitline voltage lower than the precharge voltage, the method comprising biasing the cascode transistor using the bias voltage, and supplying a control voltage to the gate terminal of the cascode transistor. The method also comprises, during a first period of the precharge phase, isolating the gate terminal of the cascode transistor from the output of the voltage generator, so as to boost the bitline voltage, and during a second period of the precharge phase, linking the gate terminal to the output of the voltage generator.

In one embodiment, isolating the gate terminal from the output of the voltage generator is performed with a switch.

In one embodiment, isolating the gate terminal from the output of the voltage generator is performed with a resistor whose anode receives the bias voltage and whose cathode is linked to the gate terminal of the cascode transistor, and a capacitor linking the anode of the resistor to ground.

In one embodiment, the resistor is a p-channel transistor configured as a resistor.

BRIEF DESCRIPTION OF THE SEVERAL VIEWS OF THE DRAWINGS

Embodiments of a sense amplifier according to the disclosure and applications thereof will be described in the following description, in relation with but not limited to the appended drawings, in which.

DETAILED DESCRIPTION

Figure 4A:
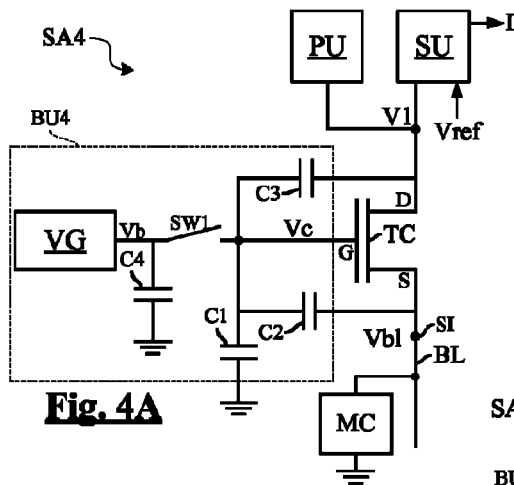
FIGS. 4A, 4B, 4C show schematically different embodiments of a sense amplifier according to the disclosure.
Figure 4B:
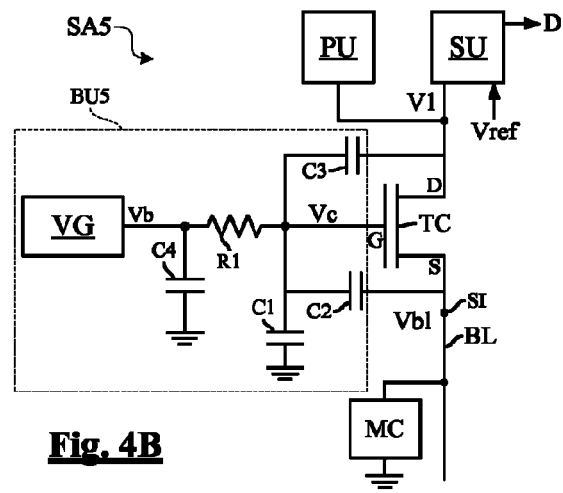
Figure 4C:
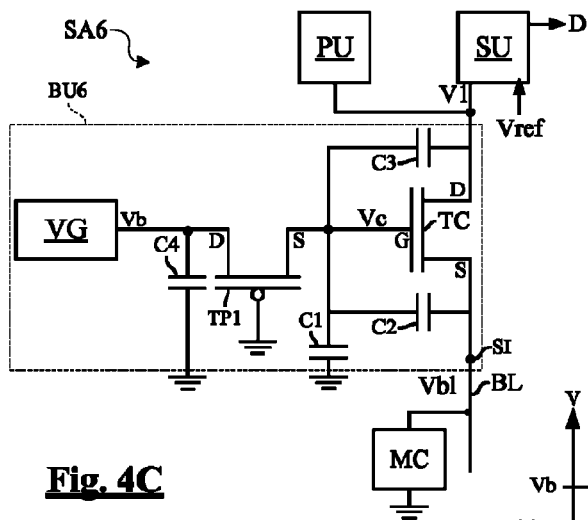

Different embodiments SA4, SA5, SA6 of a sense amplifier according to the disclosure are shown in FIGS. 4A, 4B, 4C. Each sense amplifier comprises a sensing unit SU, a precharge unit PU, a cascode transistor TC, a biasing unit, respectively BU4, BU5, BU6, and a sense input SI. The cascode transistor TC comprises a gate terminal (G), a drain terminal (D) linked to the sensing unit SU and to the precharge unit PU, and a source terminal (S) connected to the sense input SI. During operation of the sense amplifier, the sense input SI is linked, through a bitline BL, to a memory cell MC to be sensed.

As indicated above, the sensing of the memory cell MC comprises a precharge phase and a read phase. During the precharge phase, the precharge unit PU applies a precharge voltage V1 to the drain terminal of the cascode transistor TC and the biasing unit BU4, BU5, BU6 applies a control voltage Vc to the gate terminal of the cascode transistor. The source terminal (S) of the cascode transistor TC supplies a bitline voltage Vbl to the bitline BL through the sense input SI. The bitline voltage reaches a desired bitline precharge voltage Vblpre. Then, the precharge voltage V1 ceases to be applied to the cascode transistor, the sensing unit SU is enabled and the read phase starts. The sensing unit SU senses the state of the memory cell MC and outputs a data (D) representing the state of the memory cell, for example 0 if the memory cell is in a conducting state and 1 if the memory cell is not in the conducting state or in a less conducting state.

In the embodiment shown in FIG. 4A, the biasing unit BU4 comprises a voltage generator VG, a switch SW1, and capacitors C1, C2, C3, and C4. The voltage generator VG has an output linked to ground through capacitor C4 and supplying a bias voltage Vb. The gate terminal of the cascode transistor TC is linked to the output of the voltage generator VG through switch SW1. Capacitor C1 is connected between the gate terminal of the cascode transistor TC and the ground. Capacitor C2 is connected between the gate terminal and the source terminal of the cascode transistor TC. Capacitor C3 is connected between the gate terminal and the drain terminal of the cascode transistor TC. Capacitors C1, C2, C3 are for example about several femtofarads.

It will be noted that each capacitor C1, C2 or C3 may be a component provided by the designer of the circuit, or a parasitic capacitance of the cascode transistor TC (respectively gate-to-ground, gate-source or gate-drain parasitic capacitances) or a combination of a component provided by the designer and of a parasitic capacitance.

Figure 5:
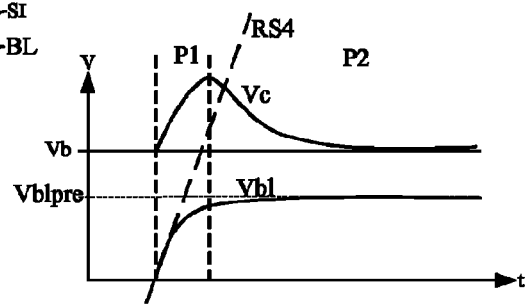
FIG. 5 shows curves of a control voltage within the sense amplifier of FIG. 4A, 4B or 4C, and of a bitline voltage supplied by the sense amplifier during a precharge phase.

FIG. 5 shows curves of the control voltage Vc and of the bitline voltage Vbl during the precharge phase. The precharge phase comprises a first period P1 during which the switch SW1 is set in the open state and a second period P2 during which the switch is set in the closed state. It is assumed that the switch SW1 has been set in the closed state during an initialization period, so that the control voltage Vc is present on the gate terminal of the cascode transistor TC when the first period P1 of the precharge phase starts, and transistor TC is in the conducting state.

At the beginning of the first period, the switch SW1 is opened (such as by a control signal supplied by a read controller) and the precharge voltage V1 is applied to the drain terminal of transistor TC. The gate terminal of transistor TC becomes floating. The bitline voltage Vbl is pulled up because transistor TC is in the conducting state and increases rapidly with a steep rising slope RS4. The control voltage Vc is also quickly pulled-up and increases rapidly because transistor TC has its gate terminal coupled to its drain terminal by capacitor C3, and coupled to its source terminal by capacitor C2. However, capacitor C1 charges gradually and prevents the control voltage Vc from increasing too abruptly.

At the beginning of the second period P2, which is triggered when the bitline voltage Vbl is close to the desired precharge voltage Vblpre, the switch SW1 is again closed and the bias voltage Vb pulls down the control voltage Vc until it is again equal to Vb. Capacitor C1 discharges and prevents the control voltage Vc from decreasing too abruptly.

Figure 1:
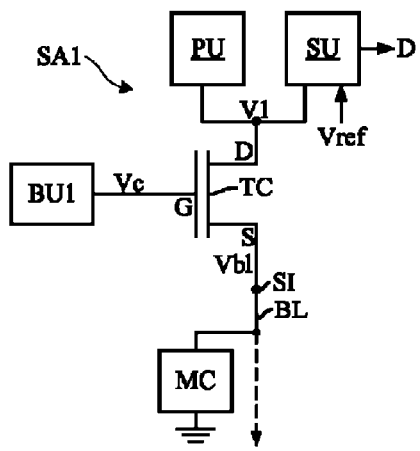
FIG. 1 is the principle diagram of a sense amplifier.
Figure 2A:
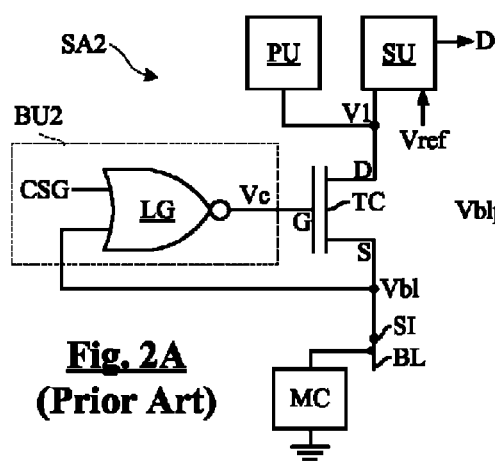
FIG. 2A shows a first conventional embodiment of a sense amplifier.
Figure 2B:
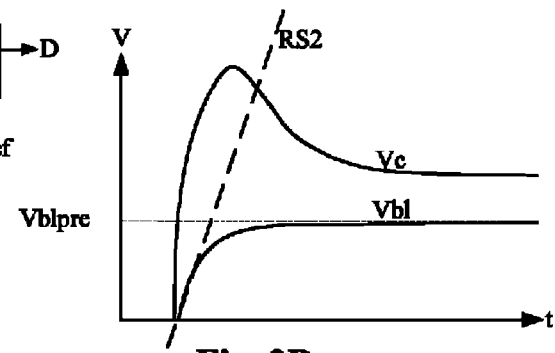
FIG. 2B shows curves of a control voltage within the sense amplifier of FIG. 2A and of a bitline voltage supplied by the sense amplifier during a precharge phase.
Figure 3A:
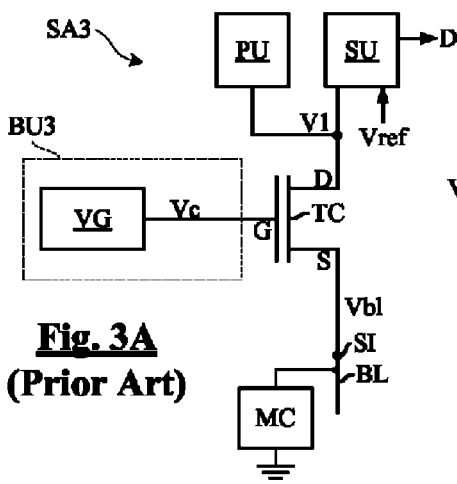
FIG. 3A shows a second conventional embodiment of a sense amplifier.
Figure 3B:
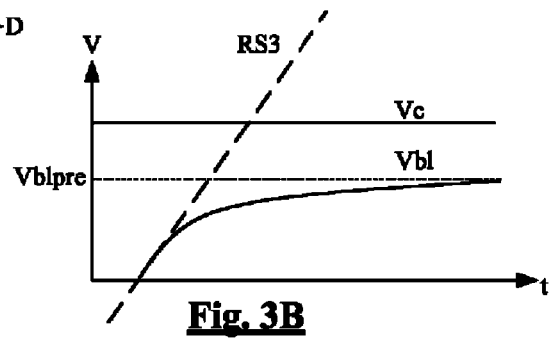
FIG. 3B shows curves of a control voltage within the sense amplifier of FIG. 3A and of a bitline voltage supplied by the sense amplifier during a precharge phase.

In summary, this embodiment provides a speed-up effect similar to that obtained from the closed loop conventional biasing unit BU2 shown in FIG. 2A, with the advantage of a low current consumption similar to that offered by the open loop biasing unit BU3 shown in FIG. 3A, thanks to a capacitive coupling mechanism.

The biasing unit BU5 shown in FIG. 4B provides equivalent advantages without using the switch SW1 and therefore without having to apply a control signal to that switch. The gate terminal of the cascode transistor TC is linked to the output of the voltage generator VG through a resistor R1, which replaces the switch SW1. The resistor R1 has a high value and may be about several kilohms.

The operation of the sense amplifier SA5 during the precharge phase is also illustrated by FIG. 5 and the precharge phase comprises first and second periods P1, P2. At the beginning of the first period P1, control voltage Vc is present on the gate terminal of the cascode transistor TC when the precharge voltage V1 is applied to the drain terminal of the cascode transistor TC. The bitline voltage Vbl is pulled up because transistor TC is in the conducting state and increases rapidly. Since the gate terminal of the cascode transistor is linked to the drain and source terminals of the transistor by capacitors C3 and C2, the control voltage Vc is also pulled-up and increases rapidly whilst resistor R1 temporarily isolates the gate terminal from the output of the voltage generator VC. During the second period of the precharge phase, capacitor C3 charges and voltage Vc is gradually pulled down by voltage Vb through resistor R1, until it becomes equal to Vb.

This embodiment also provides a speed-up effect similar to that obtained from the closed loop conventional biasing unit BU2 shown in FIG. 2A, with the advantage of a low current consumption similar to that offered by the open loop biasing unit BU1 shown in FIG. 3A, thanks to a capacitive coupling mechanism involving capacitors C1, C2, C3.

The biasing unit BU6 shown in FIG. 4C is identical to that of FIG. 4B except that resistor R1 is replaced by a p-channel transistor TP1 configured as a resistor. Transistor TP1 has its source terminal (S) connected to the gate terminal of the cascode transistor TC, its drain terminal (D) connected to the output of the voltage generator VG, and its gate terminal (G) connected to ground or to a voltage sufficiently low with respect to the bias voltage Vb to have transistor TP1 functioning as a resistor. Alternatively, the transistor TP1 may be an n-channel transistor with its gate terminal connected to a voltage higher the bias voltage Vb.

Figure 6:
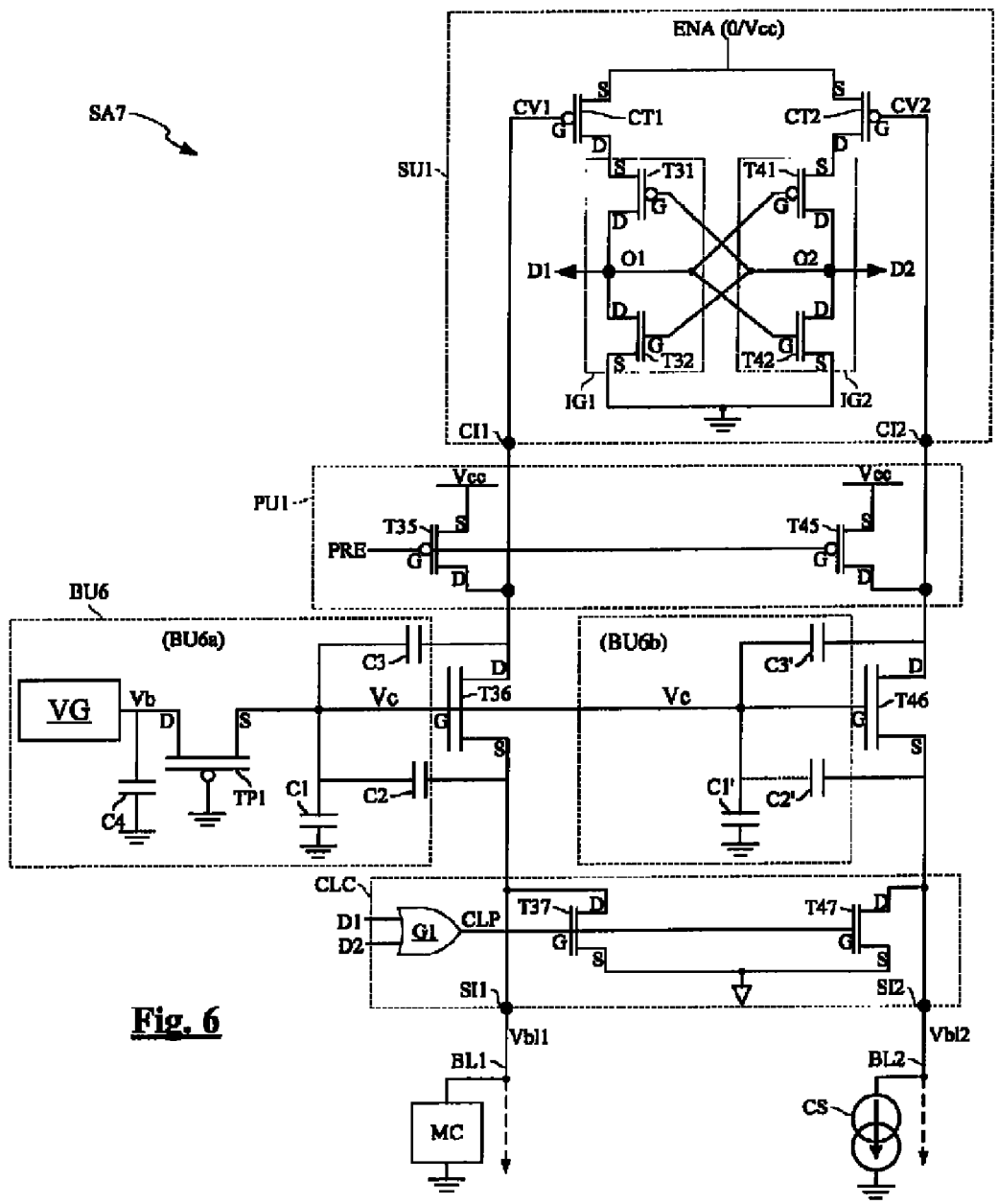
FIG. 6 shows in more detail an embodiment of a sense amplifier according to the disclosure.

A sense amplifier SA7 according to one embodiment of the disclosure is shown in FIG. 6. The sense amplifier SA7 is powered by a power supply voltage Vcc and has a first sense input SI1 and a second sense input SI2. The first sense input SI1 is linked to a memory cell MC through a bitline BL1. The second sense input SI2 is connected to a reference line BL2 linked to a current source CS or any other reference element such as a reference resistor. Alternatively, the second sense input 512 may be linked to memory cell MC through a bitline, and the first sense input SI1 may be linked to a reference line linked to a current source or another reference element.

Sense amplifier SA7 comprises a sensing unit SU1 comprising a first section IG1, a second section IG2 coupled to the first section IG1, a first output node O1 and a second output node O2. The first section IG1 has an output connected to the output node O1 and supplies a logic data signal D1. The second section IG2 has an output connected to the output node O2 and supplies a logic data signal D2. Each section IG1, IG2 is powered by an enable signal ENA which is brought to voltage Vcc (ENA=1) when the sensing unit is to be activated and is brought to ground (ENA=0) when the sensing unit is to be deactivated. Means to force to 0 data signals D1, D2 when the enable signal ENA is equal to 0 may also be provided, for example n-channel transistors connected between the outputs O1, O2 (not shown) and the ground and controlled by a signal /ENA which is equal to Vcc when ENA is equal to 0, and vice-versa.

The power supply signal ENA, that is to say the power supply voltage Vcc when ENA=1, is applied to the first section IG1 through a first p-channel control transistor CT1, and is applied to the second section IG2 through a second p-channel control transistor CT2. The gate terminal (G) of the cascode transistor CT1 forms a first control input CI1 of the sensing unit SU1 and is linked to the first sense input SI1 of sense amplifier SA7. The gate terminal (G) of transistor CT2 forms a second control input CI2 of the sensing unit and is linked to the second sense input SI2 of sense amplifier SA7.

The first control input CI1 of the sensing unit is linked to the first sense input SI1 through a cascode n-channel transistor T36 and the second control input CI2 of the sensing unit is linked to the second sense input SI2 through a cascode n-channel transistor T46. Cascode transistors T36, T46 are controlled by a control voltage Vc applied on their gate terminals and supplied by the biasing unit BU6 previously described in connection with FIG. 4, which comprises here two sections BU6a, BU6b. Section BU6a includes capacitors C1, C2, C3, for example the parasitic capacitances of transistor T36, and comprises transistor TP1, capacitor C4, and voltage generator VG. Section BU6b includes capacitors C1', C2', C3', for example the parasitic capacitances of transistor T46.

First and second sections IG1, IG2 of the sensing unit are for example cross-coupled inverting gates, the input of gate IG1 being connected to the output of gate IG2 and vice-versa. Inverting gate IG1 comprises for example p-channel transistor T31 and n-channel transistor T32 having their drain terminals (D) connected to the output node O1 and their gate terminals (G) connected to the output node O2. The source terminal (S) of transistor T32 is connected to ground and the source terminal (S) of transistor T31 is connected to the drain terminal (D) of control transistor CT1, whose source terminal (S) receives the power and enable signal ENA. Likewise, inverting gate IG2 comprises for example a p-channel transistor T41 and an n-channel transistor T42 having their drain terminals (D) connected to the output node O2 and their gate terminals (G) connected to the output node O1. The source terminal (S) of transistor T42 is connected to ground and the source terminal (S) of transistor T41 is connected to the drain terminal (D) of control transistor CT2, whose source terminal (S) receives the power and enable signal ENA.

Sense amplifier SA7 also comprises a precharge unit PU1 comprising p-channel precharge transistors T35, T45. Each precharge transistor T35, T45 has its drain terminal (D) connected to one control input of the sensing unit, respectively CI1, CI2, receives voltage Vcc on its source terminal (S), and a precharge signal PRE on its gate terminal (G).

Sense amplifier SA7 also comprises a clamp circuit CLC. The clamp circuit CLC comprises two n-channel transistors T37, T47. Each transistor T37, T47 has its drain terminal (D) connected to one sense input SI1, SI2 respectively, its source terminal (S) connected to ground, and receives a clamp signal CLP on its gate terminal (G).

In one embodiment, the clamp signal CLP is automatically activated when one of the first and second data signals D1, D2 increases and reaches a threshold voltage. The clamp signal CLP is for example supplied by an OR gate G1 that receives the first and second data signals D1, D2 in input.

As previously indicated, the second sense input SI2 is linked to the current source CS through the reference line BL2. It is assumed that the current source CS draws a constant current whose value is set between the value of a current passing through a memory cell in the high conductivity state and the value of a current passing through a memory cell in the low conductivity state.

The precharge phase starts when signal PRE is set to zero so that p-channel transistors T35, T45 become conducting. The control voltage Vc is applied to the gate terminal of transistors T36, T46 according to the first and second periods described above in connection FIG. 5. This causes the bitline voltages Vbl1 and Vbl2 to begin to increase until they reach the bitline precharge voltage Vblpre approximately equal to Vc−Vgs, Vgs being the gate-source voltage of transistors T36, T46. Control voltages CV1, CV2 on the control inputs CI1, CI2 also increase and reach a voltage equal to Vcc. It is assumed that the enable signal ENA has previously been set to zero so that the sensing unit SU1 is deactivated during the precharge phase and its output nodes O1, O2 are in the HZ state (high impedance).

Sense amplifier SA7 enters the read phase when the precharge signal PRE is switched back to 1 in order to disable transistors T35, T45. At approximately the same time, the enable signal ENA is set to 1 (Vcc). As they are no longer being charged, the bitline BL1, and the reference line BL2 begin to discharge. The bitline voltages Vbl1, Vbl2 begin to decrease from Vc−Vgs and control voltages CV1, CV2 begin to decrease from Vcc.

If the memory cell MC is in the low conductivity state, the current passing through the memory cell is less than the reference current drawn by the current source. Therefore, the reference line BL2 discharges at a faster rate than bitline BL1, and voltage Vbl2 decreases faster than voltage Vbl1. The voltage difference between Vbl1, Vbl2 is amplified by the cascode transistors T36, T46 and a larger voltage difference appears between control voltages CV1, CV2. Voltage CV2 decreases faster than voltage CV1.

If the memory cell MC is in the high conductivity state, the current passing through the memory cell is greater than the reference current drawn by the current source. Therefore, bitline BL1 discharges at a faster rate than the reference line BL2 and voltage Vbl1 decreases faster than voltage Vbl2. The voltage difference between Vbl1, Vbl2 is amplified by the cascode transistors T36, T46 and voltage CV1 decreases faster than voltage CV2.

In both cases, the voltage CV1 or CV2 that decreases the fastest reaches a threshold voltage Vth such that the corresponding transistor CT1 or CT2 becomes conducting. Transistors CT1 and CT2 being of the p-type and the sensing unit being powered by voltage Vcc (supplied as the enable signal ENA), such threshold voltage Vth is here equal to Vcc−Vtp, Vtp being the threshold voltage of p-channel transistors CT1, CT2.

For example, if voltage CV2 is the first to reach the threshold voltage Vth, control transistor CT2 is the first to become conducting. Therefore, transistor CT2 passes voltage Vcc to the inverting gate IG2, and data signal D2 on the output node O2 begins to rise. Then, signal D2 reaches a threshold value VtOR of the OR gate G1 and the clamp signal CLP goes from 0 to 1 (Vcc). When the clamp signal reaches a threshold voltage Vtn of the n-channel transistors T37, T47, the latter become conducting and connect the first and second sense inputs SI1, SI2 to ground. Bitline voltages Vbl1, Vbl2, as well as the control voltages CV1, CV2, are pulled to ground, which brings both p-channel control transistors CT1, CT2 into the fully conducting state. The sensing unit becomes fully operational and latches the provisional values of data signals D1 and D2, that is to say D1=0 and D2=1 in this example, which become the final latched data values for the current read phase.

It will be noted that the use of the gate terminal of control transistors CT1, CT2 as "sense means" in combination with powering the sensing unit through such transistors removes the need for isolation transistors, which are necessary in the prior art to disconnect the inputs of the latch from the sense inputs during the read phase, in order to sample the voltage difference between the sense input without having the output nodes of the sensing unit interacting with the sensed bitline.

In other respects, the use of the provisional values of data signals D1, D2 to activate the clamp circuit CLP, which in return causes the sensing unit to become fully operational and the provisional values of D1, D2 to be latched, makes sense amplifier SA7 "self-timed". However, embodiments where the clamp signal is activated by non self-timed means may be provided, for example a timer circuitry that is triggered when the read phase starts.

In addition, it will be noted that embodiments of a sense amplifier according to the disclosure may comprise different other types of precharge means and clamp means other than those that have been described above. In addition, the first and second sections IG1, IG2 of the latch are susceptible of different other embodiments and may comprise, for example, other logic gates such as NAND gates, NOR gates, transistors in series or parallel, etc., as deemed desirable by the skilled person wishing to implement other embodiments according to this disclosure.

Figure 7:
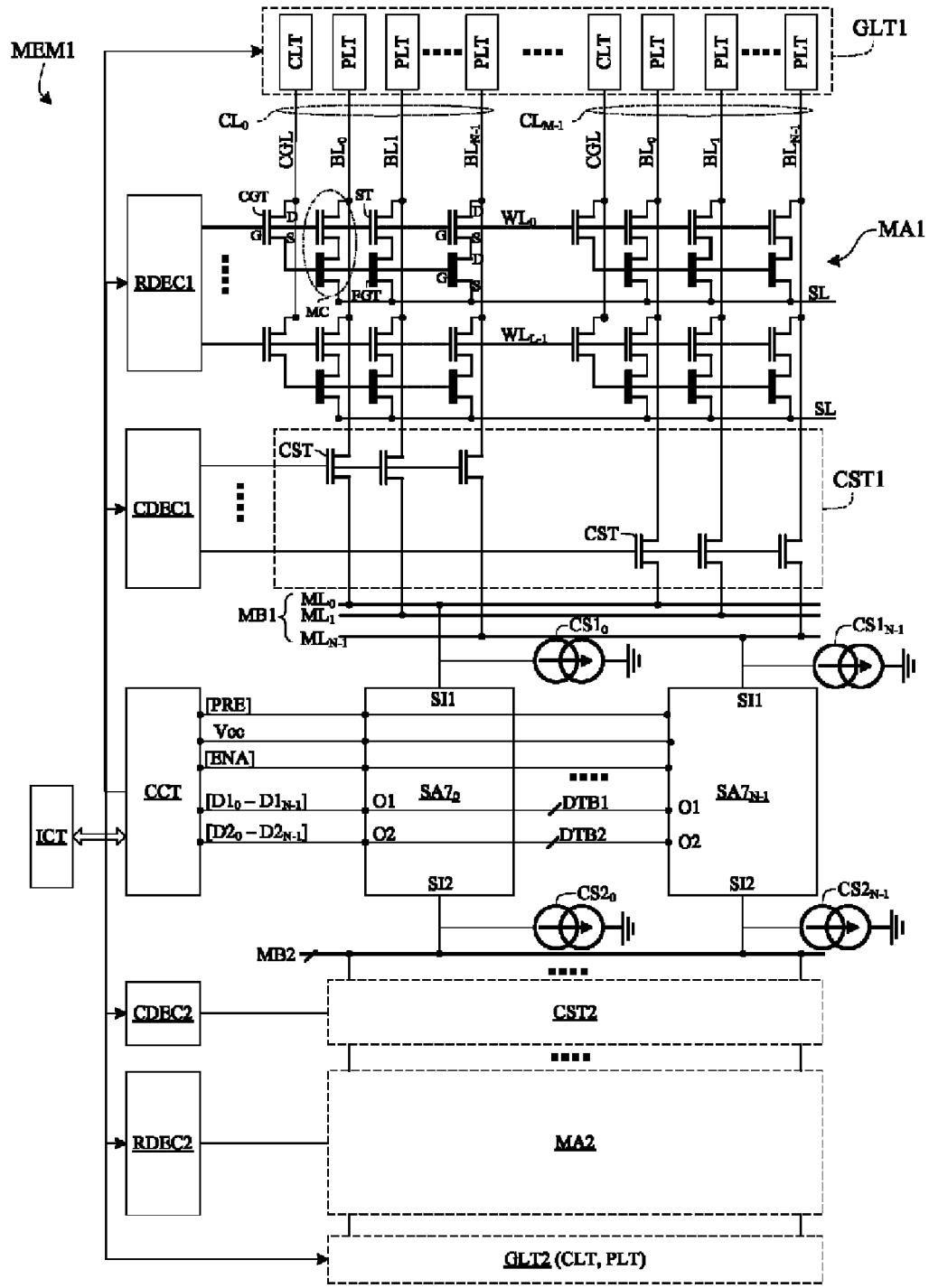
FIG. 7 shows a nonvolatile memory comprising sense amplifiers according to the disclosure.

FIG. 7 shows an example application in which a series of sense amplifiers according to the disclosure are incorporated into an electrically erasable and programmable non-volatile memory device MEM1. The memory device MEM1 comprises two memory arrays MA1, MA2. Memory array MA2, shown as a block, has the same structure as memory array MA1. Each memory array MA1, MA2 comprises L wordlines WL ($WL_0$-$WL_{L-1}$) and M columns CL ($CL_0$-$CL_{M-1}$). Each column CL comprises N bitlines BL ($BL_0$-$BL_{N-1}$) and one control gate line CGL. Each memory array MA1, MA2 comprises L*M*N memory cells MC. In this example, memory arrays MA1, MA2 are word erasable and word programmable, a word comprising memory cells of the same column connected to the same wordline.

Each memory cell MC within a word comprises a selection transistor ST and a floating gate transistor FGT. The selection transistor ST has its drain terminal (D) connected to a bitline BL, its source terminal (S) connected to the drain terminal (D) of the floating gate transistor, and its gate terminal (G) connected to a wordline WL. The floating gate transistor FGT has its source terminal (S) connected to a source line SL and its gate terminal (G) connected to the source terminal (S) of a control gate transistor CGT. The control gate transistor CGT has its gate terminal (G) connected to the considered wordline and it drain terminal (D) connected to the control gate line CGL of the considered column.

The memory device MEM1 also comprises first and second row decoders RDEC1, RDEC2; first and second column decoders CDEC1, CDEC2; first and second groups GLT1, GLT2 of column latches CLT and program latches PLT; first and second groups CST1, CST2 of column selection transistors CST; first and second multiplexing buses MB1, MB2; a central row of N sense amplifiers SA7 ($SA7_0$-$SA7_{N-1}$) according to the disclosure; and a central control circuit CCT such as a microprocessor, a micro-programmed sequencer, or a state machine receiving commands and data from the outside and supplying responses and data to the outside through an interface communication circuit ICT.

The row decoder RDEC1 supplies row selection signals to the wordlines WL ($WL_0$-$WL_{L-1}$) of memory array MA1 and the row decoder RDEC2 supplies row selection signals to the wordlines of memory array MA2. The column decoder CDEC1 supplies column selection signals to the column selection transistors CST of group CST1 and the column decoder CDEC2 supplies column selection signals to the column selection transistors of group CST2.

Bitlines of memory array MA1 belonging to different columns and having the same rank or weight (i.e. storing bits of same rank of the different words) are linked to the sense input SI1 of the same sense amplifier SA7 through the column selection transistors CST of group CST1 and the multiplexing bus MB1. Likewise, bitlines of memory array MA2 belonging to different columns and having the same rank or weight are linked to the sense input SI2 of the same sense amplifier SA7 through the column selection transistors of group CST2 and the multiplexing bus MB2. For example, bitlines $BL_0$ of columns $CL_0$ to $CL_{M-1}$ are linked to sense amplifier $SA7_0$ through transistors CST and a line $ML_0$ of the multiplexing bus MB1. Bitlines $BL_{N-1}$ of columns $CL_0$ to $CL_{M-1}$ are linked to sense amplifier $SA7_{N-1}$ through transistors CST and a line $ML_{N-1}$ of the multiplexing bus MB1.

Control circuit CCT supplies the above-described precharge signal PRE and enable signal ENA to sense amplifiers $SA7_0$-$SA7_{N-1}$. Outputs O1 of sense amplifiers $SA7_0$-$SA7_{N-1}$ are connected to different lines of a data bus DTB1 and outputs O2 are connected to different lines of a data bus DTB2.

Finally, each sense input SI1 of each sense amplifier $SA7_0$ to $SA7_{N-1}$ is linked to a current source $CS1_0$ to $CS1_{N-1}$ through a reference line and each sense input SI2 of each sense amplifier $SA7_0$ to $SA7_{N-1}$ is linked to a current source $CS2_0$ to $CS2_{N-1}$ through a reference line. Each current source CS1, CS2 is arranged between the sense input and the multiplexing lines, but may also be connected to one bitline to which the considered sense input is linked though the multiplexing bus.

Steps of programming and erasing memory cells will not be described in detail and are performed by control circuit CCT, which controls the decoders RDEC1, RDEC2, CDEC1, CDEC2 and provides them with row and column addresses received through interface ICT, as well as with control signals and a program or erase voltage Vpp. Control circuit CCT also provides the program latches with data received through the interface ICT, and the column latches are selected and activated by the column selection signals supplied by the column decoder CDEC1. Erasure of a word comprises applying voltage Vpp to the corresponding wordline, through one row decoder RDEC1 or RDEC2, and applying voltage Vpp to the corresponding control gate line CGL through the corresponding column latch CLT while the corresponding source line is connected to ground. Programming of memory cells comprises applying voltage Vpp to the corresponding bitlines through the corresponding program latches, applying voltage Vpp to the corresponding wordline, and connecting to ground the corresponding control gate line CGL through the corresponding column latch.

A step of reading of memory cells is performed by control circuit CCT by means of sense amplifiers SA7, and comprises activating the current sources of the memory array opposite the memory array in which the memory cells to be read are located, then precharging the bitlines and reading data signal D1 or D2 on the corresponding data bus DTB1 or DTB2. For example, if memory cells in the memory array MA1 are to be read, control circuit CCT first selects the corresponding wordline by means of the row decoder RDEC1, and connects the N bitlines of the concerned column to sense amplifiers $SA7_0$ to $SA7_{N-1}$ by means of the column decoder CDEC1 and through column selection transistors CST of group CST1. Circuit CCT then activates the current sources CS2 in memory array MA2, applies the precharge signal PRE and activates the voltage generator VG, and applies the enable signal ENA in the above-described manner to sense amplifiers SA7, reads data D1 on data bus DTB1 (each sense amplifier provides a bit of a word $D1_0$ to $D1_{N-1}$), then provides them to the outside through interface ICT.

It will be noted that this example embodiment of a memory device using sense amplifiers according to the disclosure has been disclosed as a non-limiting example. Embodiments of sense amplifiers according to the disclosure may be implemented in various types of memory architectures, and are usable in any application where the state of a memory cell can be determined by sensing a voltage drop on the terminals of the memory cell. Sense amplifiers SA7 may also be used in memory devices not having a dual-memory array as that described above. In that case, the second sense input SI2 is connected to a reference line that is not linked to bitlines of the memory array. Alternatively, the sense amplifier may be of a single-ended type with an internal current source.

Figure 8:
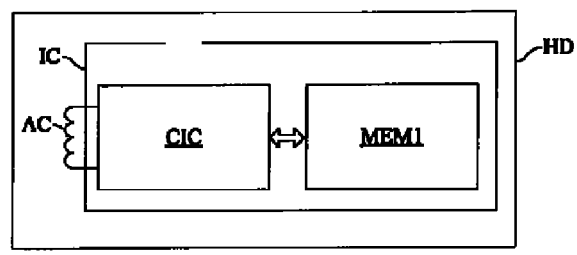
FIG. 8 shows a handheld device comprising a nonvolatile memory according to the disclosure.

A memory device comprising sense amplifiers according to the disclosure is also susceptible of various embodiments and applications. As an example, FIG. 8 schematically shows a handheld device HD comprising an integrated circuit IC within which the above-described memory MEM1 or any other type of non-volatile memory including sense amplifiers according to the disclosure is embedded. In one embodiment, the handheld device HD may be a contactless chip card, a tag, a mobile phone, a Personal Digital Assistant, etc, and may comprise a contactless communication interface circuit CIC to which the memory MEM1 is connected. The interface circuit CIC may be an NFC (Near Field Communication) interface circuit connected to an antenna coil AC, configured to exchange data by inductive coupling and load modulation, or may be a UHF (Ultra High Frequency) interface circuit connected to a UHF antenna (not shown) and configured to exchange data by electric coupling and backscattering. The handheld device HD may be configured to communicate with an external device such as a contactless card or tag reader, a POS (Point of Sale), another NFC mobile phone, etc. The memory MEM1 may be used both to store code (in particular application programs) and application data.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sense amplifier comprising:
a sense input;
a precharge unit configured to provide a precharge voltage during a precharge phase;
a voltage generator having an output and configured to provide a bias voltage;
a cascode transistor comprising a gate terminal, a drain terminal configured to receive the precharge voltage, and a source terminal configured to supply the sense input with a bitline voltage lower than the precharge voltage;

first, second, and third capacitors configured to supply a control voltage to the gate terminal of the cascode transistor based on the bias voltage, the first capacitor being coupled between the gate terminal and a ground terminal, the second capacitor being coupled between the gate and source terminals, and the third capacitor being coupled between the gate and drain terminals; and an isolating element configured to isolate the gate terminal of the cascode transistor from the output of the voltage generator during a first period of the precharge phase, so as to boost the bitline voltage, and link the gate terminal to the output of the voltage generator during a second period of the precharge phase.

2. A sense amplifier according to claim 1, wherein the isolating element includes a switch.

3. A sense amplifier according to claim 1, wherein the isolating element includes:
a resistor having a first end configured to receive the bias voltage and a second end coupled to the gate terminal of the cascode transistor, and
a capacitor linking the first end of the resistor to the ground terminal.

4. A sense amplifier according claim 1, wherein the isolating element includes:
a p-channel transistor with a drain terminal configured to receive the bias voltage, a source terminal coupled to the gate terminal of the cascode transistor, and a gate terminal coupled to the ground terminal, and
a capacitor linking the drain terminal of the p-channel transistor to the ground terminal or to a voltage terminal configured to have a voltage lower than the bias voltage.

5. A sense amplifier according to claim 1, wherein at least one of the first, second, and third capacitors is or includes a parasitic capacitance of the cascode transistor.

6. A memory array comprising:
a memory cell; and
a sense amplifier coupled to the memory cell and including:
a sense input coupled to the memory cell;
a precharge unit configured to provide a precharge voltage during a precharge phase;
a voltage generator having an output and configured to provide a bias voltage;
a cascode transistor comprising a gate terminal, a drain terminal configured to receive the precharge voltage, and a source terminal configured to supply the sense input with a bitline voltage lower than the precharge voltage;
first, second, and third capacitors configured to supply a control voltage to the gate terminal of the cascode transistor based on the bias voltage, the first capacitor being coupled between the gate terminal and a ground terminal, the second capacitor being coupled between the gate and source terminals, and the third capacitor being coupled between the gate and drain terminals; and
an isolating element configured to isolate the gate terminal of the cascode transistor from the output of the voltage generator during a first period of the precharge phase, so as to boost the bitline voltage, and link the gate terminal to the output of the voltage generator during a second period of the precharge phase.

7. A memory array according to claim 6, wherein the isolating element includes a switch.

8. A memory array according to claim 6, wherein the isolating element includes:
a resistor having a first end configured to receive the bias voltage and a second end coupled to the gate terminal of the cascode transistor, and
a capacitor linking the first end of the resistor to the ground terminal.

9. A memory array according claim 6, wherein the isolating element includes:
a p-channel transistor with a drain terminal configured to receive the bias voltage, a source terminal coupled to the gate terminal of the cascode transistor, and a gate terminal coupled to the ground terminal, and
a capacitor linking the drain terminal of the p-channel transistor to the ground terminal or to a voltage terminal configured to have a voltage lower than the bias voltage.

10. A memory array according to claim 6, wherein at least one of the first, second, and third capacitors is or includes a parasitic capacitance of the cascode transistor.

11. An integrated circuit, comprising:
a semiconductor chip; and
a memory array on the semiconductor chip, the memory array including:
a memory cell; and
a sense amplifier coupled to the memory cell and including:
a sense input coupled to the memory cell;
a precharge unit configured to provide a precharge voltage during a precharge phase;
a voltage generator having an output and configured to provide a bias voltage;
a cascode transistor comprising a gate terminal, a drain terminal configured to receive the precharge voltage, and a source terminal configured to supply the sense input with a bitline voltage lower than the precharge voltage;
first, second, and third capacitors configured to supply a control voltage to the gate terminal of the cascode transistor based on the bias voltage, the first capacitor being coupled between the gate terminal and a ground terminal, the second capacitor being coupled between the gate and source terminals, and the third capacitor being coupled between the gate and drain terminals; and
an isolating element configured to isolate the gate terminal of the cascode transistor from the output of the voltage generator during a first period of the precharge phase, so as to boost the bitline voltage, and link the gate terminal to the output of the voltage generator during a second period of the precharge phase.

12. A integrated circuit according to claim 11, wherein the isolating element includes a switch.

13. A integrated circuit according to claim 11, wherein the isolating element includes:
a resistor having a first end configured to receive the bias voltage and a second end coupled to the gate terminal of the cascode transistor, and
a capacitor linking the first end of the resistor to the ground terminal.

14. A integrated circuit according to claim 11, wherein the isolating element includes:
a p-channel transistor with a drain terminal configured to receive the bias voltage, a source terminal coupled to the gate terminal of the cascode transistor, and a gate terminal coupled to the ground terminal, and a capacitor linking the drain terminal of the p-channel transistor to the ground terminal or to a voltage terminal configured to have a voltage lower than the bias voltage.

15. A integrated circuit according to claim 11, wherein at least one of the first, second, and third capacitors is or includes a parasitic capacitance of the cascode transistor.

16. A handheld device comprising:
a communication interface circuit; and
an integrated circuit coupled to the communication interface circuit and including:
  a semiconductor chip; and
  a memory array on the semiconductor chip, the memory array including:
    a memory cell; and
    a sense amplifier coupled to the memory cell and including:
      a sense input coupled to the memory cell;
      a precharge unit configured to provide a precharge voltage during a precharge phase;
      a voltage generator having an output and configured to provide a bias voltage;
      a cascode transistor comprising a gate terminal, a drain terminal configured to receive the precharge voltage, and a source terminal configured to supply the sense input with a bitline voltage lower than the precharge voltage;
      first, second, and third capacitors configured to supply a control voltage to the gate terminal of the cascode transistor based on the bias voltage, the first capacitor being coupled between the gate terminal and a ground terminal, the second capacitor being coupled between the gate and source terminals, and the third capacitor being coupled between the gate and drain terminals; and
      an isolating element configured to isolate the gate terminal of the cascode transistor from the output of the voltage generator during a first period of the precharge phase, so as to boost the bitline voltage, and link the gate terminal to the output of the voltage generator during a second period of the precharge phase.

17. A handheld device according to claim 16, wherein the isolating element includes a switch.

18. A handheld device according to claim 16, wherein the isolating element includes:
  a resistor having a first end configured to receive the bias voltage and a second end coupled to the gate terminal of the cascode transistor, and
  a capacitor linking the first end of the resistor to the ground terminal.

19. A handheld device according claim 16, wherein the isolating element includes:
  a p-channel transistor with a drain terminal configured to receive the bias voltage, a source terminal coupled to the gate terminal of the cascode transistor, and a gate terminal coupled to the ground terminal, and
  a capacitor linking the drain terminal of the p-channel transistor to the ground terminal or to a voltage terminal configured to have a voltage lower than the bias voltage.

20. A handheld device according to claim 16, wherein at least one of the first, second, and third capacitors is or includes a parasitic capacitance of the cascode transistor.

21. A method, comprising:
performing a precharge phase on a bitline in a memory array using a sense amplifier that includes a voltage generator and a cascode transistor having a gate terminal, a drain terminal, and a source terminal, the performing including:
  supplying a control voltage to a gate terminal of the cascode transistor,
  during a first period of a precharge phase, boosting a bitline voltage on a bit line coupled to the source terminal by:
    biasing the drain terminal of the cascode transistor using a precharge voltage; and
    isolating the gate terminal of the cascode transistor from the output of the voltage generator; and
  during a second period of the precharge phase, linking the gate terminal to an output of the voltage generator.

22. A method according to claim 21, wherein isolating the gate terminal from the output of the voltage generator is performed with a switch.

23. A method according to claim 21, wherein isolating the gate terminal from the output of the voltage generator is performed with a resistor having a first end that receives the bias voltage and a second end that is linked to the gate terminal of the cascode transistor, and a capacitor linking the first end of the resistor to ground.

24. A method according to claim 23, wherein the resistor is a p-channel transistor having a grounded gate.

* * * * *